United States Patent
Morii

(10) Patent No.: US 11,218,135 B2
(45) Date of Patent: Jan. 4, 2022

(54) IMPEDANCE MATCHING DEVICE AND IMPEDANCE MATCHING METHOD

(71) Applicant: DAIHEN Corporation, Osaka (JP)

(72) Inventor: Tatsuya Morii, Osaka (JP)

(73) Assignee: DAIHEN Corporation, Osaka (JP)

( * ) Notice: Subject to any disclaimer, the term of this patent is extended or adjusted under 35 U.S.C. 154(b) by 86 days.

(21) Appl. No.: 16/722,750

(22) Filed: Dec. 20, 2019

(65) Prior Publication Data

US 2020/0212893 A1    Jul. 2, 2020

(30) Foreign Application Priority Data

Dec. 28, 2018  (JP) .............................. JP2018-248199

(51) Int. Cl.
*H03H 11/30* (2006.01)
*H01J 37/32* (2006.01)

(52) U.S. Cl.
CPC ....... *H03H 11/30* (2013.01); *H01J 37/32183* (2013.01)

(58) Field of Classification Search
CPC ........................... H03H 11/30; H01J 37/32183
See application file for complete search history.

(56) References Cited

U.S. PATENT DOCUMENTS

| | | |
|---|---|---|
| 6,677,828 B1 | 1/2004 | Harnett et al. |
| 7,251,121 B2 | 7/2007 | Bhutta |
| 7,298,128 B2 | 11/2007 | Bhutta |
| 9,196,459 B2 | 11/2015 | Bhutta |
| 9,306,533 B1 | 4/2016 | Mavretic |
| 9,345,122 B2 | 5/2016 | Bhutta |
| 9,496,122 B1 | 11/2016 | Bhutta |
| 9,525,412 B2 | 12/2016 | Mavretic |
| 9,543,122 B2 | 1/2017 | Bhutta |
| 9,584,090 B2 | 2/2017 | Mavretic |
| 9,591,739 B2 | 3/2017 | Bhutta |
| 9,697,991 B2 | 7/2017 | Bhutta |
| 9,728,378 B2 | 8/2017 | Bhutta et al. |

(Continued)

FOREIGN PATENT DOCUMENTS

| | | |
|---|---|---|
| JP | 2010-103123 A | 5/2010 |
| JP | 2012-142285 A | 7/2012 |

*Primary Examiner* — Samuel S Outten
(74) *Attorney, Agent, or Firm* — Rudy J. Ng; Bret E. Field; Bozicevic, Field & Francis LLP

(57) ABSTRACT

An impedance matching device includes: a variable capacitor; a calculation unit that calculates a reflection coefficient on the load side; a storage unit that stores the reflection coefficient calculated within a predetermined period so as to be associated with ON/OFF states of the semiconductor switches; a determination unit that determines ON/OFF states to be taken by the semiconductor switches using a calculation result within the predetermined period; a control unit that turns on or off the semiconductor switches based on the determined ON/OFF states; and a counting unit that counts the number of times the determined ON/OFF states have changed. In a case where the counted number of times is larger than a predetermined number of times, the control unit turns on or off the semiconductor switches so as to match ON/OFF states associated with a reflection coefficient closer to 0, among the stored reflection coefficients, and then prohibits ON/OFF switching.

6 Claims, 11 Drawing Sheets

(56) References Cited

U.S. PATENT DOCUMENTS

| | | |
|---|---|---|
| 9,729,122 B2 | 8/2017 | Mavretic |
| 9,745,660 B2 | 8/2017 | Bhutta |
| 9,755,641 B1 | 9/2017 | Bhutta |
| 9,844,127 B2 | 12/2017 | Bhutta |
| 9,865,432 B1 | 1/2018 | Bhutta |
| 10,026,594 B2 | 7/2018 | Bhutta |
| 10,217,608 B2 | 2/2019 | Mavretic |
| 10,340,879 B2 | 7/2019 | Mavretic et al. |
| 10,431,424 B2 | 10/2019 | Mavretic et al. |
| 10,431,428 B2 | 10/2019 | Bhutta et al. |
| 10,454,453 B2 | 10/2019 | Bhutta et al. |
| 10,455,729 B2 | 10/2019 | Bhutta |
| 10,460,912 B2 | 10/2019 | Bhutta et al. |
| 10,483,090 B2 | 11/2019 | Bhutta et al. |
| 2012/0168081 A1 | 7/2012 | Son |
| 2016/0065207 A1 | 3/2016 | Bhutta |
| 2016/0380610 A1 | 12/2016 | Ulrich |
| 2017/0178865 A1 | 6/2017 | Ulrich |
| 2018/0076788 A1 | 3/2018 | Decker et al. |
| 2019/0013183 A1* | 1/2019 | Bhutta ............... H03H 7/40 |
| 2019/0172683 A1 | 6/2019 | Mavretic et al. |
| 2019/0267212 A1 | 8/2019 | Mavretic |
| 2019/0272978 A1 | 9/2019 | Ahmed et al. |
| 2019/0326094 A1 | 10/2019 | Bhutta |

\* cited by examiner

IMPEDANCE MATCHING DEVICE AND IMPEDANCE MATCHING METHOD

CROSS-REFERENCE TO RELATED APPLICATION

This non-provisional application claims priority under 35 U.S.C. § 119(a) on Patent Application No. 2018-248199 filed in Japan on Dec. 28, 2018, the entire contents of which are hereby incorporated by reference.

FIELD

The present disclosure relates to an impedance matching device and an impedance matching method for matching the impedance of a high frequency power supply and the impedance of a load with each other.

BACKGROUND

In the case of supplying power from a high frequency power supply to a load whose impedance changes, such as a plasma processing apparatus, an impedance matching device that matches the output impedance of the high frequency power supply with an impedance as the load side is viewed from the high frequency power supply is used in order to efficiently supply the power to the load (for example, refer to Japanese Patent Laid-Open Publication No. 2012-142285).

The impedance matching device described in Japanese Patent Laid-Open Publication No. 2012-142285 includes a variable capacitor in which a plurality of series circuits of capacitors and semiconductor switches are connected in parallel. The semiconductor switches are P-Intrinsic-N (PIN) diodes. The impedance matching device is provided between the high frequency power supply and the load.

The impedance matching device described in Japanese Patent Laid-Open Publication No. 2012-142285 is configured to perform impedance matching by adjusting the capacitance of the variable capacitor by switching (turning on and off) the semiconductor switches with a control signal of a controller.

However, according to the technique described in Japanese Patent Laid-Open Publication No. 2012-142285, the resolution of the capacitance of the variable capacitor is substantially determined by the minimum value of the capacitance of the capacitor included in the variable capacitor. For this reason, in a case where the capacitance of the variable capacitor for impedance matching is near the boundary where the discrete capacitance that can be realized in the variable capacitor is switched, the ON/OFF states of the semiconductor switches included in the variable capacitor are changed. This causes a problem that impedance matching is not stable.

That is, in the course of the matching operation, in a case where the absolute value of the reflection coefficient is not equal to or less than the threshold value of the absolute value of the reflection coefficient when it is considered that matching has occurred (for example, in a case where the absolute value of the reflection coefficient is not equal to or less than 0.025), the absolute value of the reflection coefficient is reduced by changing the capacitance of the variable capacitor. In some cases, however, the absolute value of the reflection coefficient may not fall below the threshold value. In particular, this may occur in a case where the resolution of the capacitance of the variable capacitor is low. This can also occur in a case where the threshold value of the absolute value of the reflection coefficient when it is considered that matching has occurred is too small. In such a state, the operation of changing the capacitance of the variable capacitor is repeated even though matching has almost occurred. For this reason, the impedance of the load is not stable. In addition, since the operation of changing the capacitance of the variable capacitor is excessively repeated, switching loss occurs. For example, it is considered that a state, in which the impedance of the load rises or falls across the threshold value of the absolute value of the reflection coefficient when it is considered that matching has occurred (for example, a point where the absolute value of the reflection coefficient is 0.025), may occur.

SUMMARY

It is an object of the disclosure to provide an impedance matching device and an impedance matching method capable of stabilizing the state of matching with a load by suppressing the fluctuation of semiconductor switches.

An impedance matching device according to an aspect of the disclosure is an impedance matching device that is provided between a high frequency power supply and a load and acquires information regarding an impedance as the load side is viewed from an output end of the high frequency power supply or a portion equivalent to the output end in time series and performs impedance matching between the high frequency power supply and the load, the device comprising: a variable capacitor in which a plurality of series circuits of capacitors and semiconductor switches are connected in parallel; a calculation unit that calculates an impedance or a reflection coefficient on the load side using the acquired information regarding the impedance; a storage unit that stores the impedance or the reflection coefficient calculated by the calculation unit within a predetermined period so as to be associated with ON/OFF states of the semiconductor switches; a determination unit that determines ON/OFF states to be taken by the semiconductor switches using a calculation result of the calculation unit within the predetermined period; a control unit that turns on or off the semiconductor switches based on the ON/OFF states determined by the determination unit; a counting unit that counts the number of times the ON/OFF states determined by the determination unit have changed; and an extraction unit that extracts an impedance closer to a predetermined impedance or a reflection coefficient closer to 0, among the impedances or the reflection coefficients stored in the storage unit, in a case where the number of times counted by the counting unit is larger than a predetermined number of times, wherein the control unit turns on or off the semiconductor switches so as to match ON/OFF states associated with the impedance or the reflection coefficient extracted by the extraction unit and then prohibits ON/OFF switching of the semiconductor switches.

An impedance matching method according to another aspect of the disclosure is an impedance matching method for performing impedance matching between a high frequency power supply and a load using a variable capacitor which is provided between the high frequency power supply and the load and in which a plurality of series circuits of capacitors and semiconductor switches are connected in parallel, the method comprising: acquiring information regarding an impedance as the load side is viewed from an output end of the high frequency power supply or a portion equivalent to the output end in time series; calculating an impedance or a reflection coefficient on the load side using the acquired information regarding the impedance; storing the impedance or the reflection coefficient calculated within a predetermined period so as to be associated with ON/OFF states of the semiconductor switches; determining ON/OFF states to be taken by the semiconductor switches using a calculation result within the predetermined period; turning on or off the semiconductor switches based on the determined ON/OFF states; counting the number of times the determined ON/OFF states have changed; extracting an impedance closer to a predetermined impedance or a reflection coefficient closer to 0, among the stored impedances or reflection coefficients, in a case where the counted number of times is larger than a predetermined number of times; and turning on or off the semiconductor switches so as to match ON/OFF states associated with the extracted impedance or reflection coefficient and then prohibiting ON/OFF switching of the semiconductor switches.

According to this aspect, the variable capacitor in which a plurality of series circuits of capacitors and semiconductor switches are connected in parallel is provided between the high frequency power supply and the load, the information regarding the impedance or the reflection coefficient as the load side is viewed from the output end of the high frequency power supply or a portion equivalent to the output end is acquired in time series from the outside, and the current impedance or reflection coefficient on the load side is calculated using the acquired information. In addition, the portion equivalent to the output end of the high frequency power supply is, for example, an input end of the impedance matching device. The impedance or the reflection coefficient calculated within the predetermined period is stored so as to match the ON/OFF states of the semiconductor switches. In a case where the impedance on the load side is calculated, in order to adjust the capacitance of the variable capacitor so that the impedance on the load side after adjustment approaches the output impedance of the high frequency power supply, an ON/OFF state to be taken by each semiconductor switch is determined. On the other hand, in a case where the reflection coefficient is calculated, in order to adjust the capacitance of the variable capacitor so that the reflection coefficient after adjustment approaches 0, an ON/OFF state to be taken by each semiconductor switch is determined.

In a case where the number of times the ON/OFF states of the semiconductor switches have changed is larger than the predetermined number of times while such calculation, storage, and determination are executed in time series for the predetermined period, an impedance having a smaller absolute value of the difference from the predetermined impedance or a reflection coefficient having a smaller absolute value among the stored impedances or reflection coefficients is extracted. Then, the semiconductor switches are turned on or off according to the ON/OFF states associated with the extracted impedance or reflection coefficient, and then the ON/OFF operation is stopped. As a result, in a case where the ON/OFF states of the semiconductor switches are changed, the ON/OFF states of the semiconductor switches are maintained so that the impedance on the load side approaches the impedance of the high frequency power supply or the reflection coefficient on the load side approaches 0.

In the impedance matching device according to the aspect of the disclosure, the calculation unit is configured to calculate a reflection coefficient, and in a case where the ON/OFF switching of the semiconductor switches is prohibited, the control unit releases prohibition of the ON/OFF switching when an absolute value of the reflection coefficient calculated by the calculation unit is equal to or greater than a predetermined reflection coefficient that is larger than an absolute value of the reflection coefficient extracted by the extraction unit.

According to this aspect, as a result of adjusting the semiconductor switches so that the reflection coefficient on the load side after adjustment approaches 0, in a case where the ON/OFF states of the semiconductor switches are changed and the ON/OFF switching is prohibited, the absolute value of the reflection coefficient on the load side is continuously calculated in time series. Then, when the absolute value of the reflection coefficient newly calculated becomes equal to or greater than the predetermined reflection coefficient that is larger than the absolute value of the reflection coefficient associated with the ON/OFF states of the semiconductor switches while ON/OFF switching is prohibited, the prohibition of the ON/OFF switching of the semiconductor switches is released. Therefore, since a hysteresis characteristic is obtained by the prohibition and release of the ON/OFF switching of the semiconductor switches, it is possible to suppress the intermittent repetition of the fluctuation of the semiconductor switches.

In the impedance matching device according to the aspect of the disclosure, the calculation unit is configured to calculate an impedance, and in a case where the ON/OFF switching of the semiconductor switches is prohibited, the control unit releases prohibition of the ON/OFF switching when an absolute value of a difference between the impedance calculated by the calculation unit and the predetermined impedance is equal to or greater than a predetermined difference that is larger than an absolute value of a difference between the impedance extracted by the extraction unit and the predetermined impedance.

According to this aspect, as a result of adjusting the semiconductor switches so that the impedance on the load side after adjustment approaches the predetermined impedance, in a case where the ON/OFF states of the semiconductor switches are changed and the ON/OFF switching is prohibited, the impedance on the load side is continuously calculated in time series. Then, when the absolute value of the difference between the newly calculated impedance and the predetermined impedance becomes equal to or greater than the predetermined difference that is larger than the absolute value of the difference between the predetermined impedance and the impedance associated with the ON/OFF states of the semiconductor switches while ON/OFF switching is prohibited, the prohibition of the ON/OFF switching of the semiconductor switches is released. Therefore, since a hysteresis characteristic is obtained by the prohibition and release of the ON/OFF switching of the semiconductor switches, it is possible to suppress the intermittent repetition of the fluctuation of the semiconductor switches.

In the impedance matching device according to the aspect of the disclosure, the counting unit counts the number of times for each of the semiconductor switches included in the variable capacitor, and determines the largest number of times as a counting result.

According to this aspect, the number of ON/OFF times of each semiconductor switch within the predetermined period is individually counted, and the ON/OFF switching of each semiconductor switch is prohibited in a case where the number of times when the largest count value is obtained is larger than the predetermined number of times. Therefore, it is possible to reliably determine whether or not there are changes in the ON/OFF states of the semiconductor switches.

In the impedance matching device according to the aspect of the disclosure, the counting unit counts the number of times in a case where an amount of change in a capacitance of the variable capacitor, which is determined by turning on or off the semiconductor switches by the control unit, is larger than a predetermined threshold value.

According to this aspect, in a case where the amount of change in the capacitance of the variable capacitor, which is changed by ON/OFF of the semiconductor switches within the predetermined period, is larger than the predetermined threshold value, the ON/OFF switching of the semiconductor switches is prohibited. Therefore, it is possible to reliably determine whether or not there is a change in the capacitance of the variable capacitor.

According to the disclosure, it is possible to stabilize the state of matching with the load by suppressing the fluctuation of the semiconductor switches.

DETAILED DESCRIPTION

Hereinafter, the disclosure will be described in detail with reference to the diagrams illustrating embodiments thereof.

First Embodiment

Figure 1:
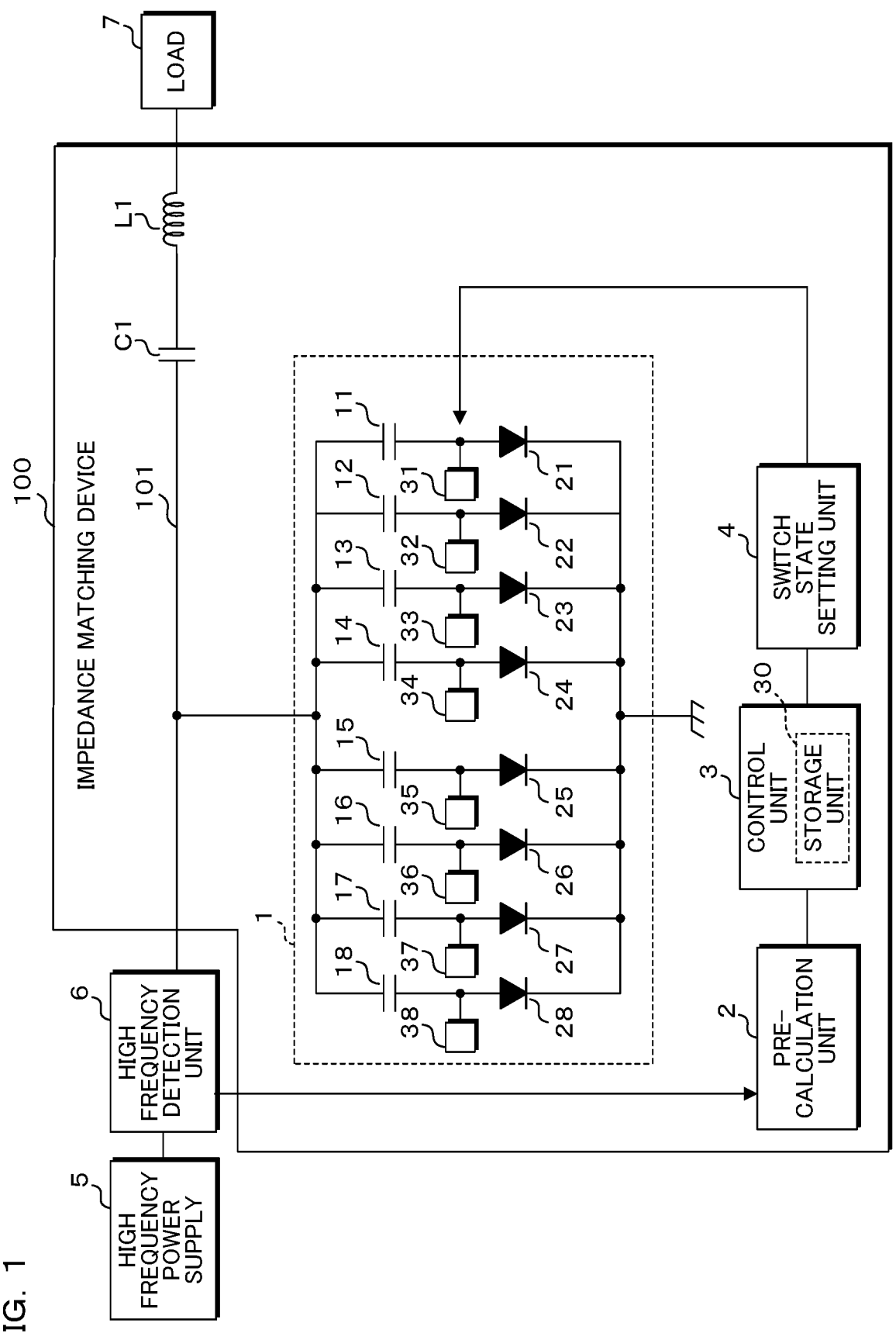
FIG. 1 is a block diagram illustrating an example of the configuration of an impedance matching device according to a first embodiment.

FIG. 1 is a block diagram illustrating an example of the configuration of an impedance matching device 100 according to a first embodiment. The impedance matching device 100 is provided between a high frequency power supply 5 that outputs high frequency power and a load 7 that consumes high frequency power. Between the high frequency power supply 5 and the impedance matching device 100, a high frequency detection unit 6 that allows high frequency power to pass therethrough and detects parameters, such as a high frequency voltage, is connected. That is, the high frequency detection unit 6 is interposed between the output end of the high frequency power supply 5 and the input end of the impedance matching device 100. The high frequency detection unit 6 may be included in the impedance matching device 100.

The high frequency power supply 5 is an AC power supply that outputs high frequency power in an industrial radio frequency (RF) band, such as 2 MHz, 13.56 MHz, 27 MHz, and 60 MHz, and the output impedance is set to a specified value, such as 50Ω. The high frequency power supply 5 includes an inverter circuit (not illustrated), and generates high frequency AC power by performing switching control of the inverter circuit.

The high frequency detection unit 6 detects parameters for calculating the impedance when the load 7 side is viewed from the output end of the high frequency power supply 5 or the input end of the impedance matching device 100 that is a portion equivalent to the output end (hereinafter, simply referred to as when the load 7 side is viewed or on the load 7 side) or parameters (corresponding to information regarding impedance) for calculating a reflection coefficient when the load 7 side is viewed. The impedance when the load 7 side is viewed is a composite impedance of the impedance of the load 7 and the impedance of the impedance matching device 100. Specifically, the high frequency detection unit 6 detects a high frequency voltage, a high frequency current, and a phase difference between the high frequency voltage and the high frequency current at its own position as parameters. Alternatively, the high frequency detection unit 6 detects high frequency traveling wave power (or traveling wave voltage) toward the load 7 and reflected wave power (or reflected wave voltage) reflected and returned from the load 7 as parameters. Using these detected parameters, a pre-calculation unit 2 to be described later calculates an impedance or a reflection coefficient on the load 7 side based on a known method.

The load 7 performs various kinds of processing using the high frequency power supplied from the high frequency power supply 5, and examples thereof include a plasma processing apparatus and a non-contact power transmission apparatus. In the plasma processing apparatus, the state of plasma changes from moment to moment as the manufacturing process, such as plasma etching and plasma CVD, proceeds. As a result, the impedance of the load 7 changes.

The impedance matching device 100 includes a variable capacitor 1 having a variable capacitance, the pre-calculation unit 2 that acquires the parameters from the high frequency detection unit 6 and calculates an impedance or a reflection coefficient on the load 7 side, and a control unit 3 that controls the capacitance of the variable capacitor 1 using the impedance or the reflection coefficient calculated by the pre-calculation unit 2. The control unit 3 has a storage unit 30. The impedance matching device 100 further includes a switch state setting unit 4 that sets a semiconductor switch, which will be described later, provided in the variable capacitor 1 to ON/OFF, so that the control unit 3 controls the capacitance of the variable capacitor 1 through the switch state setting unit 4.

In the impedance matching device 100, a transmission line 101 extending to the high frequency detection unit 6 and a series circuit of a capacitor C1 and an inductor L1 whose one end on the inductor L1 side is connected to the load 7 are connected in cascade. The variable capacitor 1 is substantially a two-terminal circuit, one end of which is connected to the transmission line 101 and the other end is connected to the ground potential. That is, the variable capacitor 1 and the series circuit of the capacitor C1 and the inductor L1 form an L type matching circuit. The capacitor C1 may be replaced with another variable capacitor 1.

Here, a case where the matching circuit is an L type has been described, but the matching circuit may be an inverted L type, T type, or π type. In addition, the series circuit of the capacitor C1 and the inductor L1 may be connected to the outside of the impedance matching device 100 (that is, between the impedance matching device 100 and the load 7). Hereinafter, a portion where high frequency power is input from the high frequency detection unit 6 to the transmission line 101 will be referred to as an input portion. In addition, a portion where high frequency power is output from the inductor L1 to the load 7 will be referred to as an output portion.

The variable capacitor 1 includes capacitors 11, 12, ..., 18 whose one ends are connected to the transmission line 101, semiconductor switches 21, 22, ..., 28 that are PIN diodes whose anodes are connected to the other ends of the capacitors 11, 12, ..., 18, and driving circuits 31, 32, ..., 38. Cathodes (the other ends) of the semiconductor switches 21, 22, ..., 28 are connected to the ground potential. Output terminals Out (refer to FIG. 2 described later) of the driving circuits 31, 32, ..., 38 are connected to connection points between the capacitors 11, 12, ..., 18 and the semiconductor switches 21, 22, ..., 28. The number of capacitors 11, 12, ..., 18, the number of semiconductor switches 21, 22, ..., 28, and the number of driving circuits 31, 32, ..., 38 are not limited to eight.

Figure 2:
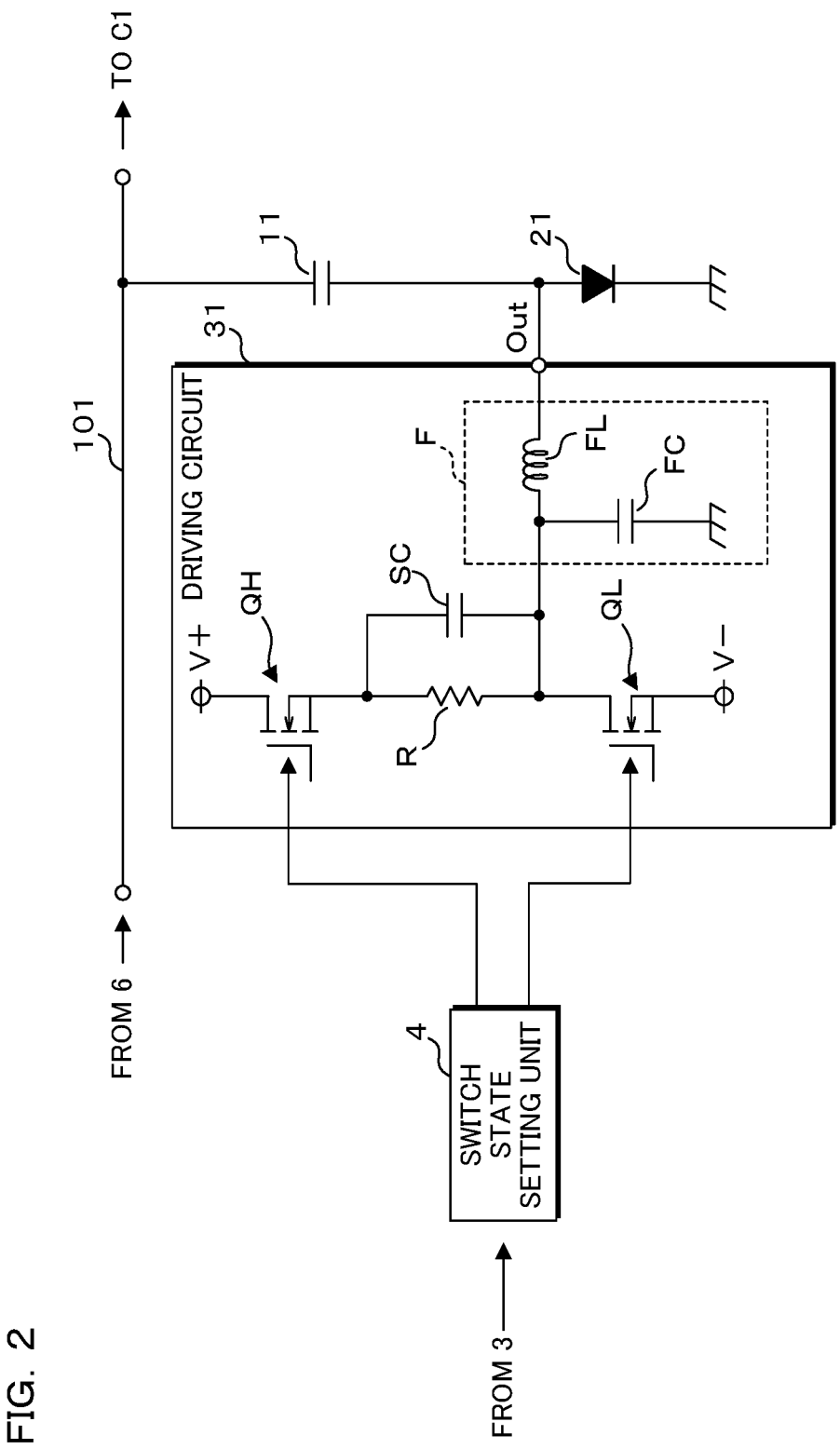
FIG. 2 is a circuit diagram illustrating an example of the configuration of a driving circuit.

FIG. 2 is a circuit diagram illustrating an example of the configuration of the driving circuit 31. The same applies to the other driving circuits 32, 33, ..., 38. The driving circuit 31 includes an N channel type metal oxide semiconductor field effect transistor (MOSFET: hereinafter, referred to as a transistor) QH whose drain is connected to a positive power supply V+ and an N channel type transistor QL whose source is connected to a negative power supply V−. Between the source of the transistor QH and the drain of the transistor QH, a parallel circuit of a resistor R and a speed-up capacitor SC are connected. The transistors QH and QL may be other switching elements, such as an insulated gate bipolar transistor (IGBT).

The driving circuit 31 further includes an L type filter F including a capacitor FC, which is connected between the drain of the transistor QL and the ground potential, and an inductor FL, which is connected between the drain of the transistor QL and an output terminal Out. High level and low level complementary driving signals are applied from the switch state setting unit 4 to the gate of the transistor QH and the gate of the transistor QL. The voltage of the high level driving signal may be equal to the voltage of the positive power supply V+, for example. The voltage of the low level driving signal may be equal to the voltage of the negative power supply V−, for example.

In a case where a low level driving signal is applied to the gate of the transistor QL and a high level driving signal is applied to the gate of the transistor QH, the transistor QL is turned off and the transistor QH is turned on. Then, a forward current flows from the positive power supply V+ to the semiconductor switch 21 through the transistor QH, the resistor R, the speed-up capacitor SC, and the inductor FL included in the filter F, so that the semiconductor switch 21 is turned on. As a result, the capacitance of the capacitor 11 is included in the capacitance of the entire variable capacitor 1.

On the other hand, in a case where a low level driving signal is applied to the gate of the transistor QH and a high level driving signal is applied to the gate of the transistor QL, the transistor QH is turned off and the transistor QL is turned on. Then, a backward current is applied from the negative power supply V− to the anode of the semiconductor switch 21 through the transistor QL and the inductor FL, so that the semiconductor switch 21 is turned off. As a result, the capacitance of the capacitor 11 is not included in the capacitance of the entire variable capacitor 1. As described above, the capacitance of the variable capacitor 1 is adjusted.

Returning to FIG. 1, in the first embodiment, the capacitance of some or all of the capacitors 11, 12, ..., 18 increases in a stepwise manner. More specifically, assuming that the capacitance of the capacitor 11 is Cmin, it is preferable that the capacitances of the capacitors 11, 12, ..., 18 are expressed by $Cmin \times 2^{i-1}$ (i=1, 2, ..., 8). In this manner, the capacitance of the variable capacitor 1 can be set to $2^8$ magnitudes in increments of Cmin.

The pre-calculation unit 2 includes, for example, a field programmable gate array (FPGA), and acquires parameters for calculating the impedance on the load 7 side or parameters for calculating the reflection coefficient on the load 7 side from the high frequency detection unit 6. The pre-calculation unit 2 calculates and averages the impedance or the reflection coefficient on the load 7 side using the acquired parameters, and outputs the averaged impedance or reflection coefficient to the control unit 3.

The control unit 3 includes a central processing unit (CPU) (not illustrated), and controls the operation of each unit according to a control program stored in advance in a read only memory (ROM) and performs processing, such as input and output, calculation, and time measurement. A computer program that defines the procedure of each process by the CPU may be loaded in advance into a random access memory (RAM) using means (not illustrated), and the loaded computer program may be executed by the CPU. Alternatively, the control unit 3 may be configured by a microcomputer or a dedicated hardware circuit.

The control unit 3 acquires the impedance or the reflection coefficient on the load 7 side that has been calculated by the pre-calculation unit 2. In a case where the impedance on the load 7 side is acquired, the control unit 3 can determine the combination of the capacitors 11, 12, ..., 18 of the variable capacitor 1 so that the impedance on the load 7 side matches the output impedance of the high frequency power supply 5 (first form). On the other hand, in a case where the reflection coefficient on the load 7 side is acquired, the control unit 3 can determine the combination of the capacitors 11, 12, ..., 18 of the variable capacitor 1 so that the reflection coefficient at the input portion approaches 0 (second form). If the magnitude of the reflection coefficient falls within the allowable range, it is considered that matching has occurred. By such control, power is efficiently supplied from the high frequency power supply 5 to the load 7.

In addition, the control unit 3 can acquire the impedance on the load 7 side calculated by the pre-calculation unit 2 and further calculate a reflection coefficient on the load 7 side, and determine the combination of the capacitors 11, 12, ..., 18 of the variable capacitor 1 using the calculated reflection coefficient (third form). Focusing on the example of the third form, the following description will be given on the assumption that the control unit 3 determines the combination of the capacitors 11, 12, . . . , 18 using the reflection coefficient on the load 7 side. The determined combination of the capacitors 11, 12, . . . , 18 corresponds to ON/OFF states to be taken by the semiconductor switches 21, 22, . . . , 28.

The switch state setting unit 4 sets the ON/OFF states of the semiconductor switches 21, 22, . . . , 28 according to the combination of the capacitors 11, 12, . . . , 18 determined by the control unit 3, that is, ON/OFF states to be taken by the semiconductor switches 21, 22, . . . , 28. In a case where the ON/OFF states of the semiconductor switches 21, 22, . . . , 28 are set by the switch state setting unit 4, the above-described complementary driving signals are applied to the corresponding driving circuits 31, 32, . . . , 38. As a result, the ON/OFF states of the semiconductor switches 21, 22, . . . , 28 of the variable capacitor 1 are newly controlled. Then, the capacitance of the variable capacitor 1 is adjusted to the capacitance calculated by the control unit 3.

Figure 3:
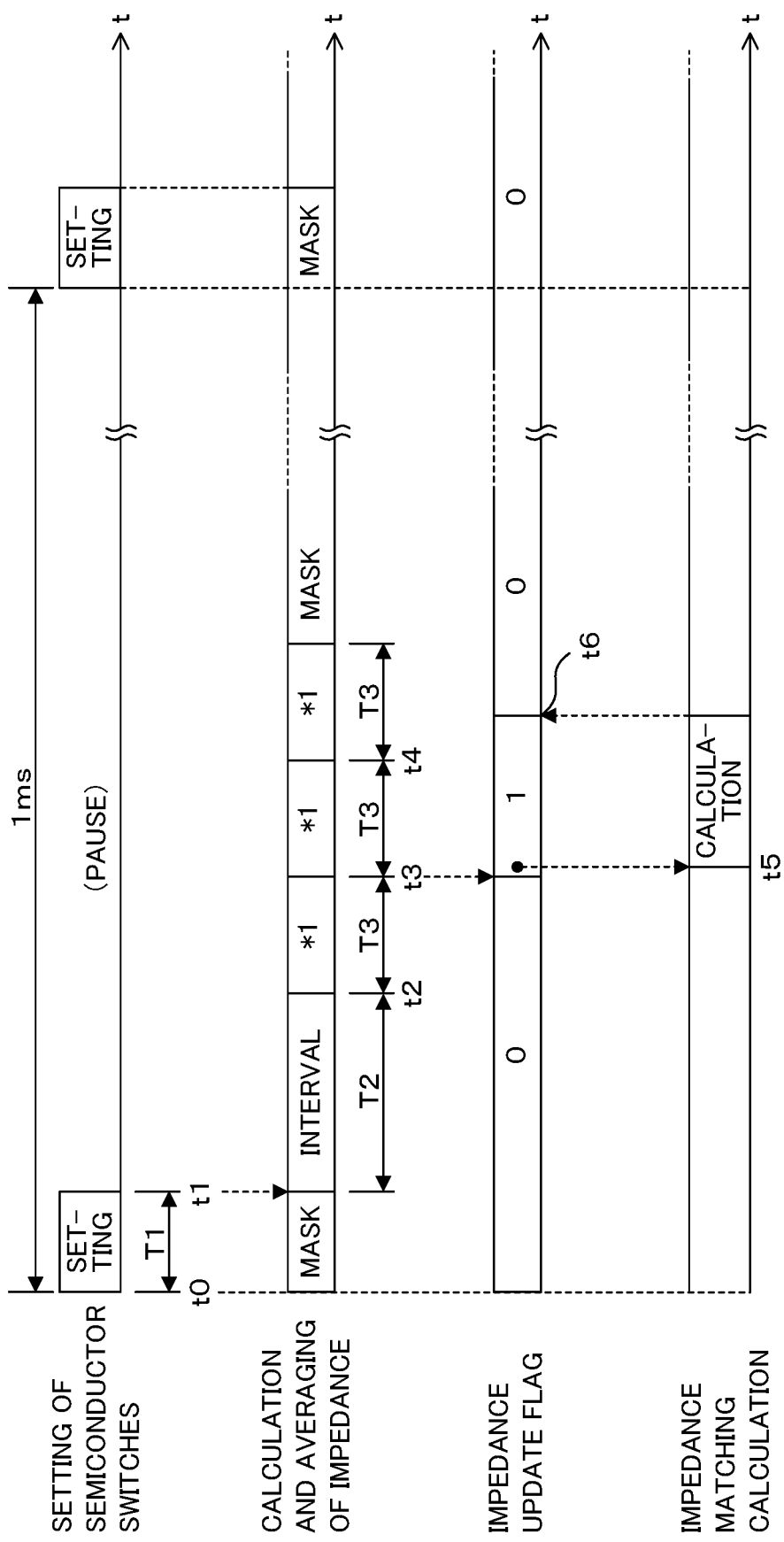
FIG. 3 is a timing chart showing the operation of the impedance matching device according to the first embodiment.

Next, the operation flow of the entire impedance matching device 100 in the case of matching the impedance on the load 7 side with the output impedance of the high frequency power supply 5 will be described. FIG. 3 is a timing chart showing the operation of the impedance matching device 100 according to the first embodiment. The four timing charts shown in FIG. 3 all have the same time axis (t) as the horizontal axis. In order from the top, timings for performing setting of the semiconductor switches 21, 22, . . . , 28, calculation and averaging of the impedance on the load 7 side, setting and clearing of an impedance update flag, and impedance matching calculation are schematically shown. In the following description, it is assumed that B1, B2, . . . , B7 indicate the bit numbers of the semiconductor switches 21, 22, . . . , 28.

In the impedance matching device 100 according to the first embodiment, the sequence shown in FIG. 3 appears periodically, for example, once every 1 ms, but the period of the sequence is not limited to 1 ms. During this 1 ms, the capacitance of the variable capacitor 1 is calculated once, and the bits of the semiconductor switches 21, 22, . . . , 28 are set to ON or OFF based on the calculated capacitance. Among the operations corresponding to the timing charts shown in FIG. 3, the calculation and averaging of impedance and the setting and clearing of the impedance update flag are executed by the FPGA included in the pre-calculation unit 2 (hereinafter, simply referred to as an FPGA), and operations corresponding to the other two timing charts are executed by the CPU provided in the control unit 3 (hereinafter, simply referred to as a CPU).

The settings of the semiconductor switches 21, 22, . . . , 28 performed from time t0 to time t1 are executed by the CPU during the time T1 according to the ON/OFF state determined in the immediately preceding period starting 1 ms before the time to. Here, the semiconductor switches 21, 22, . . . , 28 are set in descending order of the bit numbers from the semiconductor switch 28 that is the most significant bit, but may be set in ascending order of the bit numbers from the semiconductor switch 21 that is the least significant bit. In a case where the CPU can control ON/OFF of the semiconductor switches 21, 22, . . . , 28 in parallel, settings of all the semiconductor switches 21, 22, . . . , 28 may be performed at the same time. The CPU applies a mask signal to the FPGA, and turns off the mask signal when the setting of the semiconductor switch 21 (corresponding to B1) executed immediately before time t1 is completed.

One FPGA senses the mask signal applied from the CPU, and sets an interval of time T2 from when the mask signal is turned off to when the calculation and averaging of the impedance on the load 7 side are started. The length of the time T2 is, for example, 30 µs. This interval is a time to wait until the impedance on the load 7 side is stabilized by the setting of the semiconductor switch 21 executed immediately after time t7.

In a case where the above interval ends at time t2, the FPGA acquires a parameter for calculating the impedance on the load 7 side from the high frequency detection unit 6 multiple times during time T3, and calculates and averages the impedance on the load 7 side each time the parameter is acquired. The length of the time T3 is, for example, 15 µs. In a case where the first calculation and averaging end at time t3, the FPGA sets the impedance update flag cleared by the CPU before time t0 to 1. Thereafter, the FPGA repeats the calculation and averaging of the impedance on the load 7 side during time T3 starting from time t3 and time t4. The calculation and averaging are repeated until the mask signal is turned on by the CPU.

The CPU senses the impedance update flag set by the FPGA, and does not perform a matching calculation while the update flag is cleared to 0. In a case where the CPU senses that the impedance update flag is set to 1 at time t5, the CPU performs an impedance matching calculation and clears the impedance update flag to 0 at time t6 at which the matching calculation ends. Then the CPU turns on the mask signal applied to the FPGA.

The matching calculation herein is processing for acquiring the averaged impedance on the load 7 side from the FPGA, calculating the capacitance of the variable capacitor 1 so that the impedance on the load 7 side matches the output impedance of the high frequency power supply 5, and determining the ON/OFF states to be taken by the semiconductor switches 21, 22, . . . , 28. The ON/OFF states determined by the matching calculation are set in the semiconductor switches 21, 22, . . . , 28 during the time T1 in the next starting period. The operation from the matching calculation to the setting of the semiconductor switches 21, 22, . . . , 28 is hereinafter referred to as a matching operation.

In a case where the capacitance of the variable capacitor 1 calculated by the above matching calculation is near the boundary where the discrete capacitance that can be realized in the variable capacitor 1 is switched, the ON/OFF states of the semiconductor switches 21, 22, . . . , 28 included in the variable capacitor 1 may be changed to make the matching operation unstable. Therefore, in the first embodiment, the minimum value of the absolute value of the reflection coefficient (hereinafter, may be simply referred to as a reflection coefficient) when the load 7 side is viewed during a period, in which the ON/OFF states of the semiconductor switches 21, 22, . . . , 28 are changed, is extracted, and the ON/OFF states of the semiconductor switches 21, 22, . . . , 28 when the extracted minimum reflection coefficient is obtained are reproduced and maintained. In addition, the absolute value of the reflection coefficient to be extracted is not limited to the minimum value, and a value closer to 0 or a value relatively close to 0 may be extracted.

Figure 4:
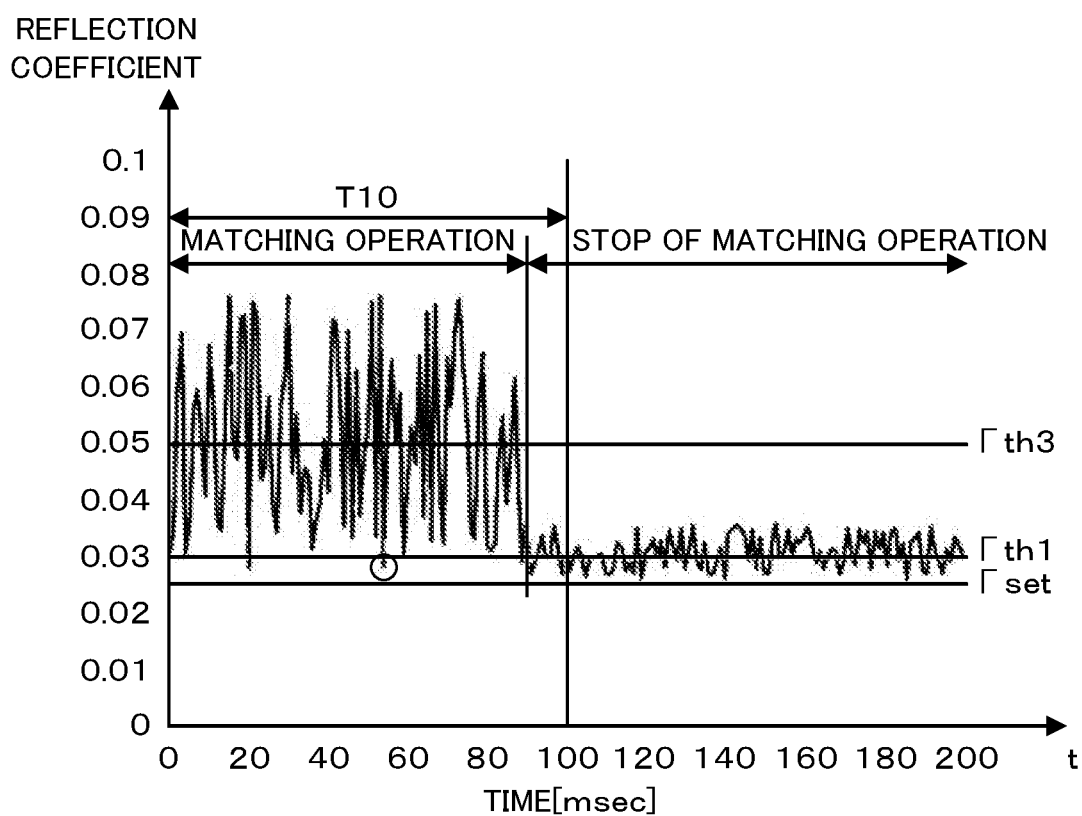
FIG. 4 is a schematic diagram showing an example of a change in a reflection coefficient during a matching operation and during the stop of the matching operation.

FIG. 4 is a schematic diagram showing an example of a change in the reflection coefficient during the matching operation and during the stop of the matching operation. In FIG. 4, the horizontal axis indicates time, and the vertical axis indicates a reflection coefficient. In FIG. 4, time T10 indicates the maximum length of a period for monitoring a change in the reflection coefficient. The time T10 is, for example, 100 ms. The CPU stores the ON/OFF states of the semiconductor switches 21, 22, . . . , 28 when a change in the reflection coefficient occurs during the matching operation within the time T10, in the storage unit 30, so as to be associated with the reflection coefficient, and counts the number of times of the change.

In a case where the number of times of the reflection coefficient change within the time T10 is larger than a predetermined number of times, the CPU stops the matching operation and extracts the stored minimum value of the reflection coefficient. In a case where the matching operation is performed every 1 ms within the time T10 of 100 ms, the predetermined number of times is, for example, 90 times. In the example shown in FIG. 4, since the reflection coefficient changes approximately between 0.028 and 0.077 during the matching operation, 0.028 that is the minimum reflection coefficient is extracted (refer to a circle). In a case where the number of times of the reflection coefficient change within the time T10 is not larger than the predetermined number of times, the CPU clears the count value of the number of times of the change and repeats the matching operation within the time T10.

Then, in order to reproduce the ON/OFF states of the semiconductor switches 21, 22, . . . , 28 corresponding to the extracted minimum reflection coefficient, the CPU reads the ON/OFF states of the semiconductor switches 21, 22, . . . , 28 stored in the storage unit 30 in association with the reflection coefficient of 0.028, and sets the read states in the switch state setting unit 4. As a result, the ON/OFF states of the semiconductor switches 21, 22, . . . , 28 are set to be the same as the states when the reflection coefficient is 0.028. Thereafter, the CPU stops the matching operation. While the matching operation is stopped, the capacitance of the variable capacitor 1 does not change. The reason why the reflection coefficient changes while the matching operation is stopped even though the capacitance of the variable capacitor 1 is constant is that the impedance of the load 7 changes to some extent.

As for the number of times of the reflection coefficient change, for example, the number of times of ON/OFF state change may be counted for each of the semiconductor switches 21, 22, . . . , 28, and the number of times when the largest count value is obtained may be set as the number of times of change. As another method of counting the number of times of change, for example, in a case where the amount of change in the capacitance of the variable capacitor 1 calculated by the matching calculation from the previous time is larger than a predetermined threshold value, the number of times of change may be counted. The predetermined threshold value may be, for example, the magnitude of the capacitance of the capacitor 11 that determines the resolution of the capacitance of the variable capacitor 1.

In a case where the amount of change in the impedance of the load 7 becomes relatively large while the matching operation is stopped, it is preferable to resume the matching operation.

Therefore, even when the matching operation is stopped, the calculation of the reflection coefficient when the load 7 side is viewed is continued. When the reflection coefficient calculated during this time becomes equal to or greater than a predetermined reflection coefficient that is larger than the minimum value of the reflection coefficient during the previous matching operation, the matching operation is resumed.

Figure 5:
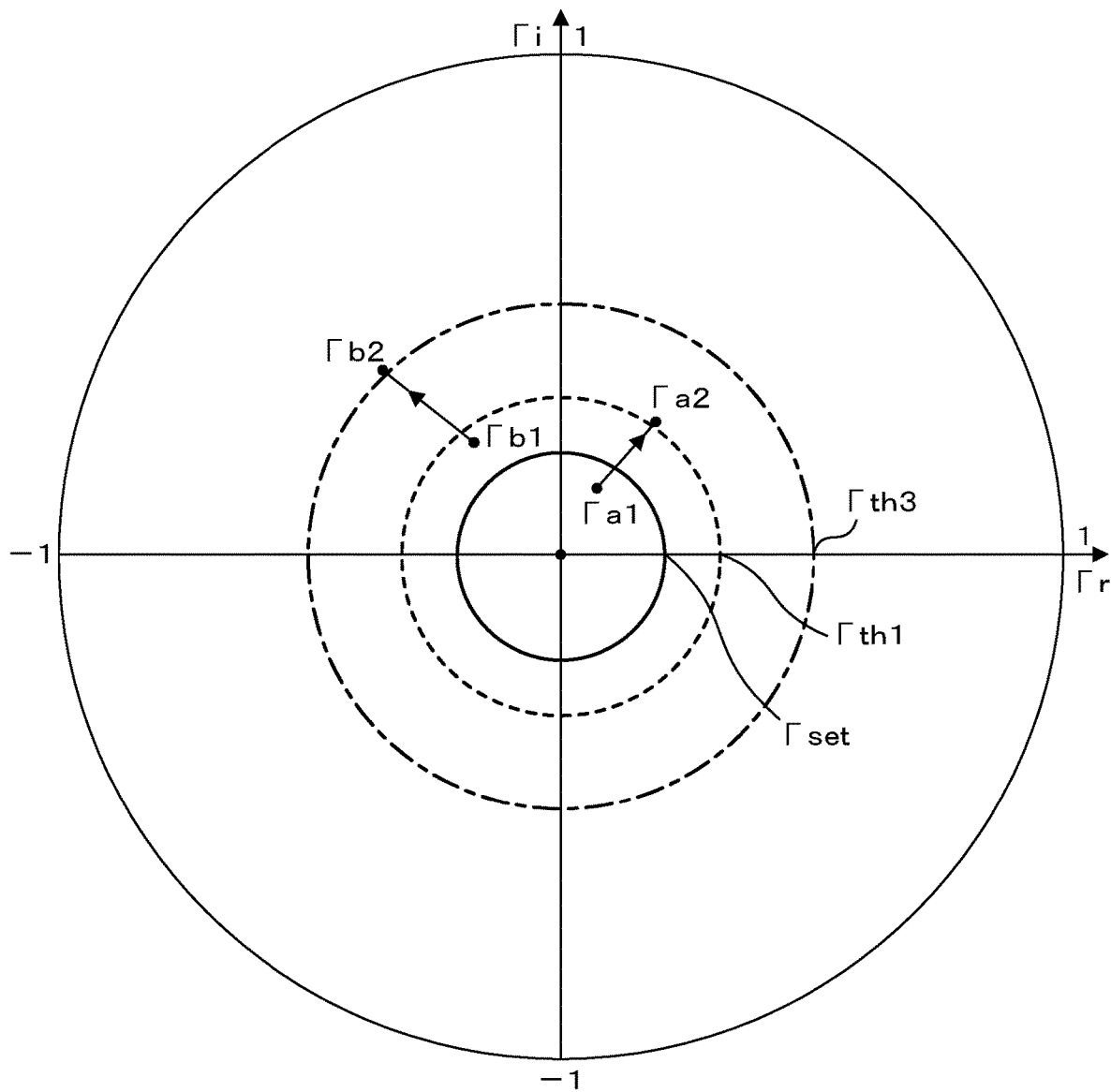
FIG. 5 is a schematic diagram illustrating an example of a change in a reflection coefficient before and after resumption of a matching operation.

FIG. 5 is an explanatory diagram illustrating a reflection coefficient $\Gamma$ projected on the Smith chart. In addition, in FIG. 5, illustration of isoresistance circles, isoreactance circles, and the like used in the Smith chart is omitted, and only circles indicating the absolute value of the reflection coefficient $\Gamma$ are illustrated. Therefore, the absolute value of the reflection coefficient $\Gamma$ at the center position in FIG. 5 is 0, and the absolute value of the reflection coefficient $\Gamma$ on the outer side is 1. In addition, here, it is assumed that the reflection coefficient $\Gamma$ is a complex number expressed by $\Gamma r+j\Gamma i$. Therefore, in FIG. 5, the horizontal axis is the real axis corresponding to $\Gamma r$ that is the real part of $\Gamma$, and the vertical axis is the imaginary axis corresponding to $\Gamma i$ that is the imaginary part of $\Gamma$. A region surrounded by a solid circle in the diagram is a region where the absolute value of the reflection coefficient is equal to or less than $\Gamma$set. In addition, a region surrounded by a broken-line circle is a region where the absolute value of the reflection coefficient is equal to or less than $\Gamma$th1. In addition, a region surrounded by a one-dot chain line circle is a region where the absolute value of the reflection coefficient is equal to or less than $\Gamma$th3. In the example shown in FIG. 4, $\Gamma$set, $\Gamma$th1, and $\Gamma$th3 are 0.025, 0.03, and 0.05, respectively.

First, a normal matching operation will be described. $\Gamma$set is a threshold value when it is considered that matching has occurred. When the absolute value of the reflection coefficient $\Gamma$ becomes equal to or less than the threshold value $\Gamma$set during the matching operation, it is considered that matching has occurred and the matching operation is stopped (refer to $\Gamma$a1 in FIG. 5). Then, when the absolute value of the reflection coefficient $\Gamma$ becomes equal to or greater than the threshold value $\Gamma$th1 due to the change in the load impedance (refer to $\Gamma$a2 in FIG. 5), the matching operation is resumed. That is, since the threshold value $\Gamma$th1 for resuming the matching operation is larger than the threshold value $\Gamma$set for stopping the matching operation, a hysteresis characteristic appears. In this manner, instability due to excessive change in the capacitance of the variable capacitor 1 is suppressed.

Next, a case will be described in which a state, in which the absolute value of the reflection coefficient $\Gamma$ does not become equal to or less than the threshold value $\Gamma$set during the matching operation and an operation of changing the capacitance of the variable capacitor 1 is repeated, occurs. As described with reference to FIG. 4, after the absolute value of the minimum reflection coefficient within the time T10 is extracted, the state of the variable capacitor 1 at the time of the extracted absolute value of the reflection coefficient is reproduced (refer to $\Gamma$b1 in FIG. 5). Then, when the absolute value of the reflection coefficient $\Gamma$ becomes equal to or greater than the threshold value $\Gamma$th3 due to the change in the load impedance (refer to $\Gamma$b2 in FIG. 5), the matching operation is resumed. By performing such control, it is possible to prevent a situation in which the absolute value of the reflection coefficient $\Gamma$ does not become equal to or less than the threshold value $\Gamma$set and the operation of changing the capacitance of the variable capacitor 1 excessively is repeated. In this specification, as described above, the control in a case where the state, in which the absolute value of the reflection coefficient $\Gamma$ does not become equal to or less than the threshold value $\Gamma$set during the matching operation and the operation of changing the capacitance of the variable capacitor 1 is repeated, occurs is referred to as "unstable operation prevention control".

Figure 6:
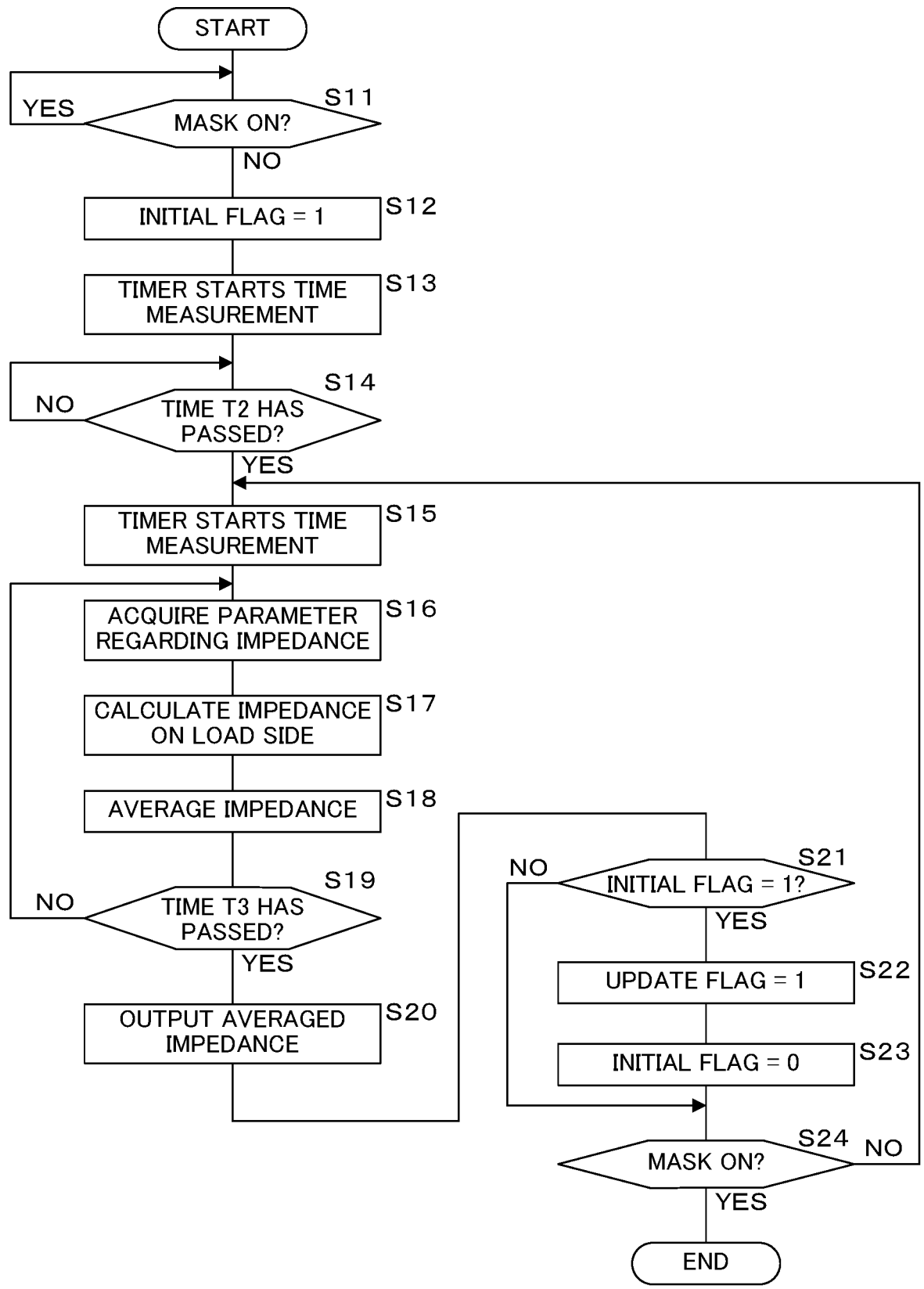
FIG. 6 is a flowchart illustrating the processing procedure of an FPGA that calculates and averages the impedance on the load side.
Figure 7:
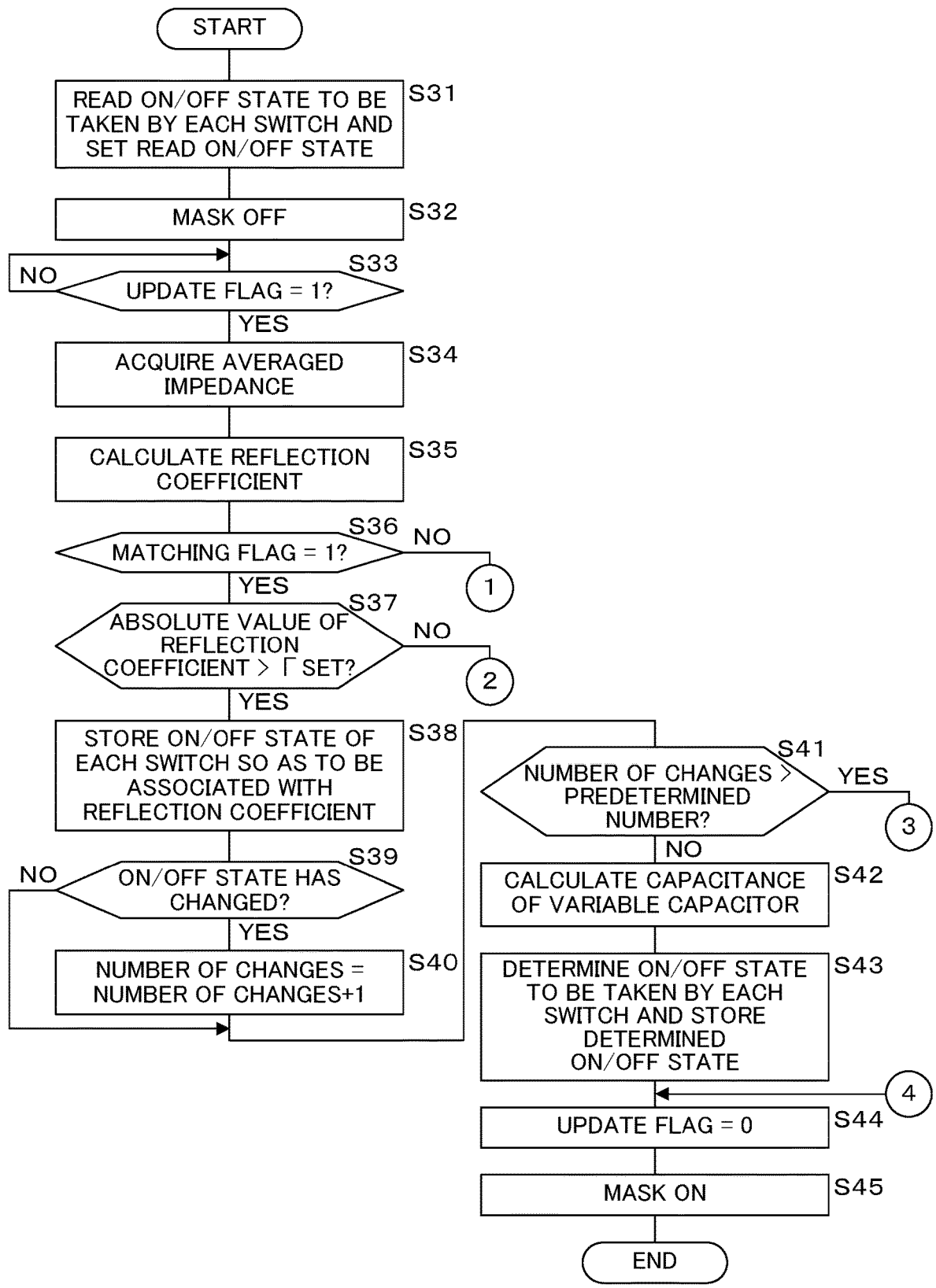
FIG. 7 is a flowchart illustrating the processing procedure of a CPU that performs an impedance matching operation in the impedance matching device according to the first embodiment.
Figure 8:
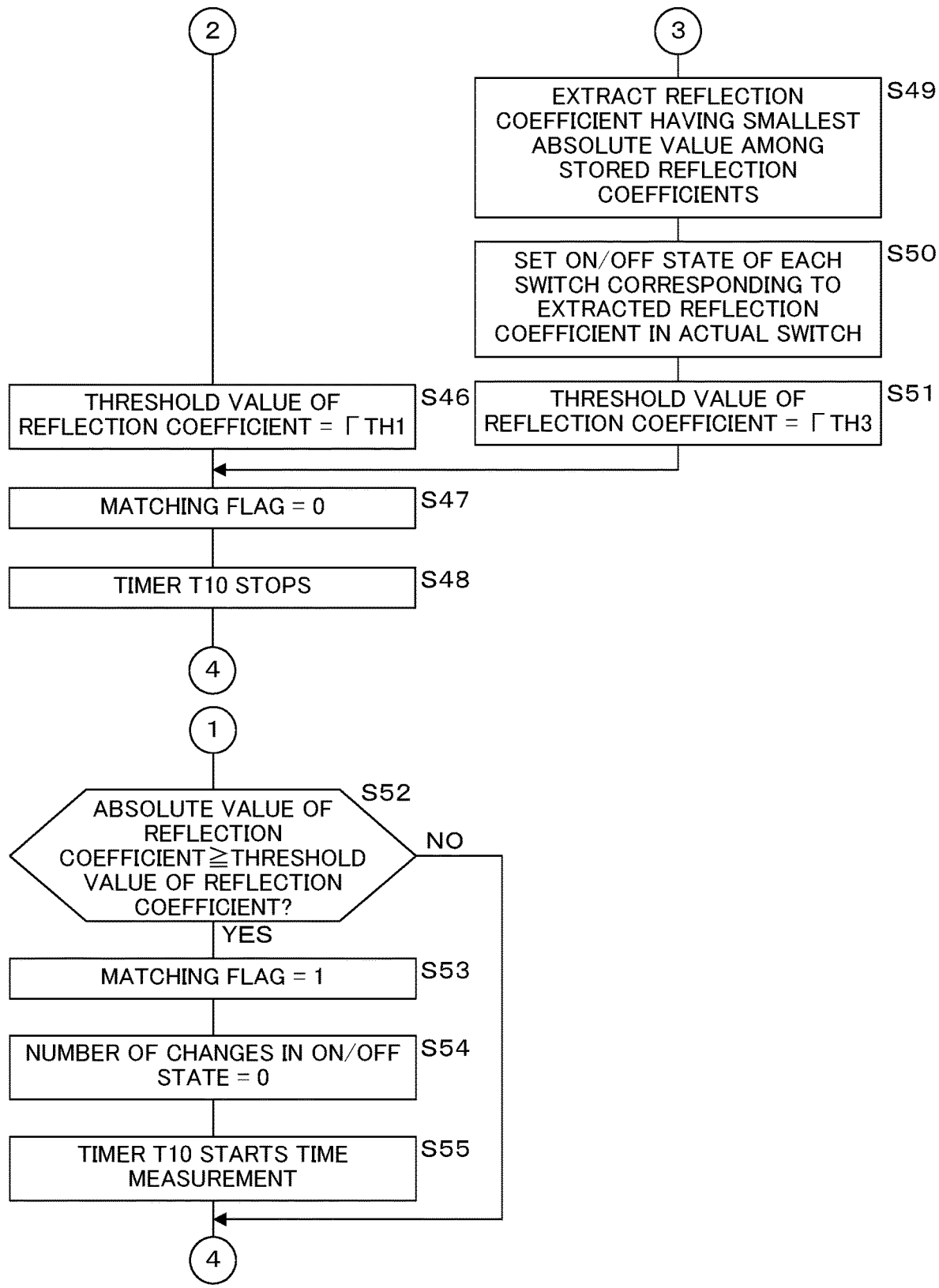
FIG. 8 is a flowchart illustrating the processing procedure of the CPU that performs an impedance matching operation in the impedance matching device according to the first embodiment.
Figure 9:
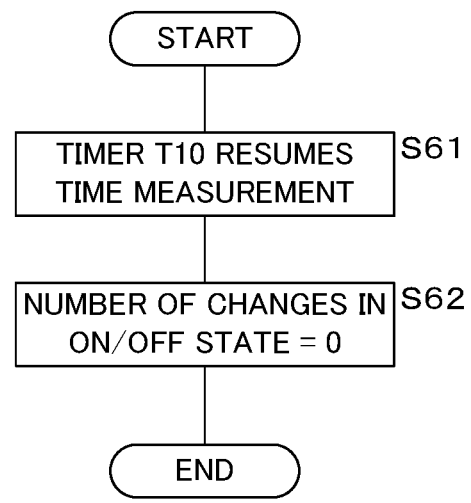
FIG. 9 is a flowchart illustrating the processing procedure of the CPU for repeating a matching operation within time T10.

Hereinafter, the operations of the pre-calculation unit 2 and the control unit 3 described above will be described with reference to the flowcharts illustrating the operations. FIG. 6 is a flowchart illustrating the processing procedure of the FPGA that calculates and averages the impedance on the load 7 side. FIGS. 7 and 8 are flowcharts illustrating the processing procedure of the CPU that performs an impedance matching operation in the impedance matching device 100 according to the first embodiment. In addition, FIG. 9 is a flowchart illustrating the processing procedure of the CPU for repeating the matching operation within the time T10.

The process illustrated in FIG. 6 is started with an interval sufficiently shorter than 1 ms, for example, and is executed by the FPGA. The process illustrated in FIG. 7 is started, for example, every 1 ms, and executed by the CPU according to a computer program stored in advance in a ROM (not illustrated). The process illustrated in FIG. 9 is started each time a timer t10 that counts the time T10 performs time-up, and executed by the CPU. The timer t10 is a general-purpose timer (not illustrated) provided in the control unit 3, and the time measurement is started by initialization.

In FIGS. 6 and 7, the impedance update flag is simply referred to as an update flag, and the mask signal is simply referred to as a mask. The initial value of the update flag is 0, and the initial value of the mask signal is ON. In FIGS. 7 and 8, the semiconductor switch is simply referred to as a switch. The initial flag in FIG. 6 is a flag indicating that this is the first processing for calculating and averaging the impedance. The matching flag in FIGS. 7 and 8 is a flag indicating that the CPU is performing a matching operation in which a matching calculation is periodically repeated, and the initial value is 1. The number of changes is a counter for counting the number of times of ON/OFF state change, and the initial value is 0.

In a case where the process illustrated in FIG. 6 is started, the FPGA determines whether or not the mask signal is ON (S11). In a case where the mask signal is ON (S11: YES), the FPGA waits until the mask signal is turned off. In a case where the mask signal is turned off and the mask is removed (S11: NO), the FPGA sets the initial flag to 1 (S12), and starts time measurement using a timer (not illustrated) (S13). Then, the FPGA determines whether or not the time T2 has passed by the time measurement of the timer (S14). In a case where the time T2 has not passed (S14: NO), the FPGA waits until the time T2 passes. This time T2 is the above-described interval, and is, for example, 30 μs.

In a case where the interval of time T2 has passed (S14: YES), the FPGA starts time measurement using a timer (S15), and acquires information regarding the impedance, that is, parameters for calculating the impedance on the load 7 side, from the high frequency detection unit 6 (S16). Then, the FPGA calculates the impedance on the load 7 side using the acquired parameters (S17), and averages the calculated impedance in a sequential manner (S18). One calculation of the impedance ends within a time of 100 ns or less, for example. Then, the FPGA determines whether or not the time T3 has passed by the time measurement of the timer (S19). In a case where the time T3 has not passed (S19: NO), the process proceeds to step S16. This time T3 is, for example, 15 μs.

In a case where the time T3 has elapsed (S19: YES), the FPGA outputs the averaged impedance on the load 7 side (more specifically, data indicating the impedance) to the CPU (S20). Then, the FPGA determines whether or not the initial flag is set to 1 (S21). In a case where the initial flag is set to 1 (S21: YES), that is, in a case where the calculation and averaging of the impedance end first, the FPGA sets the impedance update flag to 1 (S22) and clears the initial flag to 0 (S23).

In a case where the processing of step S23 ends or in a case where the initial flag is not set to 1 in step S21 (S21: NO), the FPGA determines whether or not the mask signal is ON (S24). In a case where the mask signal is not still ON (S24: NO), the process proceeds to step S15 to repeat the calculation and averaging of the impedance on the load 7 side. On the other hand, in a case where the mask signal is turned on to perform masking again (S24: YES), the FPGA ends the process illustrated in FIG. 6.

In addition, parameters for calculating the reflection coefficient may be acquired in step S16, reflection coefficients when the load 7 side is viewed may be calculated in step S17, the reflection coefficients may be averaged in step S18, and the averaged reflection coefficient may be output in step S20.

In a case where the process illustrated in FIG. 7 is started, the CPU reads ON/OFF states to be taken by the semiconductor switches 21, 22, ..., 28 from the storage unit 30 and sets the read ON/OFF states in the switch state setting unit 4 (S31). As a result, the ON/OFF states of the semiconductor switches 21, 22, ..., 28 are set so that the capacitance of the variable capacitor 1 becomes the capacitance previously calculated in step S41 to be described later. Then, the CPU turns off the mask signal (S32), and determines whether or not the impedance update flag is set to 1 (S33). In a case where the impedance update flag is not set to 1 (S33: NO), the CPU waits until the impedance update flag is set to 1.

In a case where the impedance update flag is set to 1 (S33: YES), the CPU acquires the averaged impedance from the pre-calculation unit 2 (S34), and calculates the reflection coefficient when the load 7 side is viewed (S35). That is, the pre-calculation unit 2 and the processing of steps S34 and S35 correspond to a calculation unit. In addition, in a case where the reflection coefficient is output in step S20 of FIG. 6, it is assumed that the reflection coefficient is acquired in step S34 instead of the processing of step S35. This case corresponds to the second form described above, and the pre-calculation unit 2 corresponds to a calculation unit.

Then, the CPU determines whether or not the matching flag is set to 1 (S36). In a case where the matching flag is set to 1 (S36: YES), the CPU determines whether or not the absolute value of the reflection coefficient calculated in step S35 is larger than Γset (S37). In a case where the absolute value of the reflection coefficient is larger than Γset (S37: YES), the CPU stores the ON/OFF states of the semiconductor switches 21, 22, ..., 28 read in step S31 in the storage unit 30 so as to be associated with the reflection coefficient (S38).

Then, the CPU determines whether or not the latest ON/OFF state stored in the storage unit 30 has changed from the ON/OFF state stored immediately before (S39). In a case where the latest ON/OFF state stored in the storage unit 30 has changed (S39: YES), the CPU increments the number of changes stored in the storage unit 30 by 1 (S40). In a case where the ON/OFF state stored in the storage unit 30 has not changed (S39: NO) or in a case where the processing of step S40 ends, the CPU determines whether or not the number of changes is larger than a predetermined number of times (for example, 90 times) (S41).

In a case where the number of changes is not larger than the predetermined number of times (S41: NO), the CPU calculates the capacitance of the variable capacitor 1 so that the impedance on the load 7 side matches the output impedance of the high frequency power supply 5 (S42). Then, the CPU determines ON/OFF states to be taken by the semiconductor switches 21, 22, ..., 28 so that the capacitance of the variable capacitor 1 becomes the calculated capacitance, and stores the determined ON/OFF states in the storage unit 30 for the processing of step S31 in the next time (S43).

Then, the CPU clears the impedance update flag to 0 (S44), turns on the mask signal (S45), and ends the process illustrated in FIG. 7.

In a case where the absolute value of the reflection coefficient is equal to or less than Γset in step S37 (S37: NO), the process proceeds to FIG. 8 in which the CPU sets the threshold value of the reflection coefficient to Γth1 (S46), clears the impedance matching flag to 0 (S47), and stops the timer t10 (S48). As a result, the matching operation is stopped. Then, the CPU moves the processing to step S44 in FIG. 7.

In a case where the number of changes described above is larger than the predetermined number of times, the CPU performs "unstable operation prevention control". Here, a case will be described in which the absolute value of the reflection coefficient does not become equal to or less than the threshold value Γset when the number of changes is equal to or less than the predetermined number of times. In a case where the number of changes is larger than the predetermined number of times in step S41 (S41: YES), the process proceeds to FIG. 8 in which the CPU extracts a reflection coefficient having the smallest absolute value, that is, a reflection coefficient closest to 0, among the reflection coefficients stored in the storage unit 30 (S49). Then, the CPU causes the switch state setting unit 4 to set the ON/OFF states of the semiconductor switches 21, 22, . . . , 28 corresponding to the extracted reflection coefficient in the actual semiconductor switches 21, 22, . . . , 28 (S50). Then, the CPU sets the threshold value of the reflection coefficient to Γth3 (S51), and moves the processing to step S47.

In a case where the matching flag is not set to 1 in step S36 (S36: NO), the process proceeds to FIG. 8 in which the CPU determines whether or not the absolute value of the reflection coefficient calculated in step S35 is equal to or greater than the threshold value of the reflection coefficient set in step S46 or S51 (S52). In a case where the absolute value of the reflection coefficient calculated in step S35 is not equal to or greater than the threshold value (S52: NO), the process proceeds to step S44 in FIG. 7.

On the other hand, in a case where the absolute value of the reflection coefficient is equal to or greater than the threshold value of the reflection coefficient (S52: YES), the CPU sets the matching flag to 1 (S53), clears the number of changes in the ON/OFF state counted in step S39 to 0 (S54), and then starts time measurement using the timer t10 (S55). Then, the process proceeds to step S44 in FIG. 7.

In step S31 illustrated in FIG. 7 described above, regardless of whether or not each bit of the semiconductor switches 21, 22, . . . , 28 changes, ON/OFF of the semiconductor switches 21, 22, . . . , 28 is newly set for all the bits. However, the invention is not limited to this. For example, bits that change from ON to OFF or from OFF to ON among the semiconductor switches 21, 22, . . . , 28 may be extracted, and ON/OFF of the semiconductor switches 21, 22, . . . , 28 may be switched only for the extracted bits.

In addition, in step S31 of FIG. 7, ON/OFF of the semiconductor switches 21, 22, . . . , 28 is newly set even during the stop of the matching operation in which the ON/OFF states of the semiconductor switches 21, 22, . . . , 28 are not changed. However, in a case where the matching flag is not set to 1, the processing of step S31 may not be executed.

Then, in a case where the process illustrated in FIG. 9 is started, the CPU resumes time measurement using the timer t10 (S61), clears the number of changes in the ON/OFF state stored in the storage unit 30 to 0 (S62), and ends the process illustrated in FIG. 9. After the end of the process illustrated in FIG. 9, the matching operation is continued only for the subsequent time T10.

As described above, according to the first embodiment, the variable capacitor 1 in which a series circuit of the capacitor 11 and the semiconductor switch 21, a series circuit of the capacitor 12 and the semiconductor switch 22, . . . , a series circuit of the capacitor 18 and the semiconductor switch 28 are connected in parallel is provided between the high frequency power supply 5 and the load 7. Then, parameters regarding the impedance when the load 7 side is viewed from the output end of the high frequency power supply 5 or the input end of the impedance matching device are acquired from the high frequency detection unit 6 (step S16), and the current impedance or reflection coefficient on the load 7 side is calculated using the acquired parameters (step S17). In a case where the impedance on the load 7 side is calculated, the reflection coefficient on the load 7 side is further calculated (step S35). The reflection coefficient calculated within the predetermined time T10 is stored in the storage unit 30 so as to be associated with the ON/OFF states of the semiconductor switches 21, 22, . . . , 28. Then, in order to adjust the capacitance of the variable capacitor 1 so that the reflection coefficient after adjustment approaches 0, ON/OFF states to be taken by the semiconductor switches 21, 22, . . . , 28 are determined (step S43).

In a case where the number of times the ON/OFF states of the semiconductor switches 21, 22, . . . , 28 have changed is larger than the predetermined number of times (90 times) while such calculation, storage, and determination are executed in time series for the time T10, a reflection coefficient having the smallest absolute value among the reflection coefficients stored in the storage unit 30 is extracted. Then, the semiconductor switches 21, 22, . . . , 28 are turned on or off according to the ON/OFF states associated with the extracted reflection coefficient, and then the ON/OFF operation is stopped. As a result, in a case where the ON/OFF states of the semiconductor switches 21, 22, . . . , 28 are changed, the ON/OFF states of the semiconductor switches 21, 22, . . . , 28 are maintained so that the reflection coefficient on the load 7 side is minimized. Therefore, it is possible to stabilize the state of matching with the load 7 by suppressing the fluctuation of the semiconductor switches 21, 22, . . . , 28.

In addition, according to the first embodiment, as a result of adjusting the semiconductor switches 21, 22, . . . , 28 so that the reflection coefficient on the load 7 side after adjustment approaches 0, in a case where the ON/OFF states of the semiconductor switches 21, 22, . . . , 28 are changed and the ON/OFF switching is prohibited, the absolute value of the reflection coefficient on the load 7 side is continuously calculated in time series. Then, when the absolute value of the reflection coefficient newly calculated becomes equal to or greater than the predetermined reflection coefficient Γth1 or Γth3 that is larger than the absolute value of the reflection coefficient associated with the ON/OFF states of the semiconductor switches 21, 22, . . . , 28 while ON/OFF switching is prohibited, the prohibition of the ON/OFF switching of the semiconductor switches 21, 22, . . . , 28 is released. Therefore, since a hysteresis characteristic is obtained by the prohibition and release of the ON/OFF switching of the semiconductor switches 21, 22, . . . , 28, it is possible to suppress the intermittent repetition of the fluctuation of the semiconductor switches 21, 22, . . . , 28.

In addition, according to the first embodiment, the number of ON/OFF times of the semiconductor switches 21, 22, . . . , 28 within the time T10 is individually counted, and the ON/OFF switching of the semiconductor switches 21, 22, . . . , 28 is prohibited in a case where the number of times when the largest count value is obtained is larger than the predetermined number of times (90 times). Therefore, it is possible to reliably determine whether or not there are changes in the ON/OFF states of the semiconductor switches 21, 22, . . . , 28.

In addition, according to the first embodiment, in a case where the amount of change in the capacitance of the variable capacitor 1 that changes when the semiconductor switches 21, 22, . . . , 28 are turned on or off within the time T10 is larger than the predetermined threshold value (for example, Cmin), ON/OFF switching of the semiconductor switches 21, 22, . . . , 28 may be prohibited. Therefore, it is possible to reliably determine whether or not there is a change in the capacitance of the variable capacitor 1.

Second Embodiment

In the first embodiment, the control unit 3 determines the combination of the capacitors 11, 12, . . . , 18 using the reflection coefficient on the load 7 side. On the other hand, in a second embodiment, the control unit 3 determines the combination of the capacitors 11, 12, . . . , 18 using the impedance on the load 7 side. Since the configuration of an impedance matching device 100 according to the second embodiment is the same as that in the case of the first embodiment, the corresponding portions are denoted by the same reference numerals, and the description thereof will be omitted. The first embodiment and the second embodiment are different in a part of the processing procedure of the CPU. The processing procedure of the FPGA is the same as that illustrated in FIG. 6 of the first embodiment.

In the second embodiment, the control unit 3 acquires the impedance on the load 7 side calculated by the pre-calculation unit 2, and determines the combination of the capacitors 11, 12, . . . , 18 of the variable capacitor 1 so that the impedance on the load 7 side matches the output impedance of the high frequency power supply 5. That is, the second embodiment corresponds to the first form described above.

In a case where the capacitance of the variable capacitor 1 calculated by the matching calculation described in FIG. 3 of the first embodiment is near the boundary where the discrete capacitance that can be realized in the variable capacitor 1 is switched, the ON/OFF states of the semiconductor switches 21, 22, . . . , 28 included in the variable capacitor 1 may be changed to make the matching operation unstable. Therefore, in the second embodiment, among the impedances when the load 7 side is viewed during a period in which the ON/OFF states of the semiconductor switches 21, 22, . . . , 28 are changed, an impedance closest to the impedance of the high frequency power supply 5 (that is, an impedance when the absolute value of the difference between this impedance and the impedance of the high frequency power supply 5 is the smallest) is extracted, and the ON/OFF states of the semiconductor switches 21, 22, . . . , 28 when the extracted impedance is obtained are reproduced and maintained. In addition, the impedance to be extracted is not limited to the impedance closest to the impedance of the high frequency power supply 5, and an impedance closer to the impedance of the high frequency power supply 5 or an impedance relatively close to the impedance of the high frequency power supply 5 may be extracted.

Similar to the case described in FIG. 4 of the first embodiment, the CPU stores the ON/OFF states of the semiconductor switches 21, 22, . . . , 28 when a change in the impedance occurs during the matching operation within the time T10, in the storage unit 30, so as to be associated with the impedance, and counts the number of times of the change. In a case where the number of times of the impedance change within the time T10 is larger than a predetermined number of times (for example, 90 times), the CPU extracts an impedance closest to the impedance of the high frequency power supply 5 among the stored impedances. In a case where the number of times of the impedance change within the time T10 is not larger than the predetermined number of times, the CPU clears the count value of the number of times of the change and repeats the matching operation within the time T10.

Then, in order to reproduce the ON/OFF states of the semiconductor switches 21, 22, . . . , 28 corresponding to the extracted impedance, the CPU reads the ON/OFF states of the semiconductor switches 21, 22, . . . , 28 stored in the storage unit 30 in association with the extracted impedance, and sets the read states in the switch state setting unit 4. As a result, the ON/OFF states of the semiconductor switches 21, 22, . . . , 28 are set to be the same as the states when the impedance on the load 7 side is closest to the impedance of the high frequency power supply 5. Thereafter, the CPU stops the matching operation.

In a case where the amount of change in the impedance of the load 7 becomes relatively large while the matching operation is stopped, it is preferable to resume the matching operation. Therefore, even when the matching operation is stopped, the calculation of the impedance when the load 7 side is viewed is continued. In a case where the absolute value of the difference between the impedance calculated during this time and the impedance of the high frequency power supply 5 (hereinafter, simply referred to as the difference) becomes equal to or greater than a predetermined difference that is larger than the difference between the impedance extracted after the previous matching operation and the impedance of the high frequency power supply 5, the matching operation is resumed.

Figure 10:
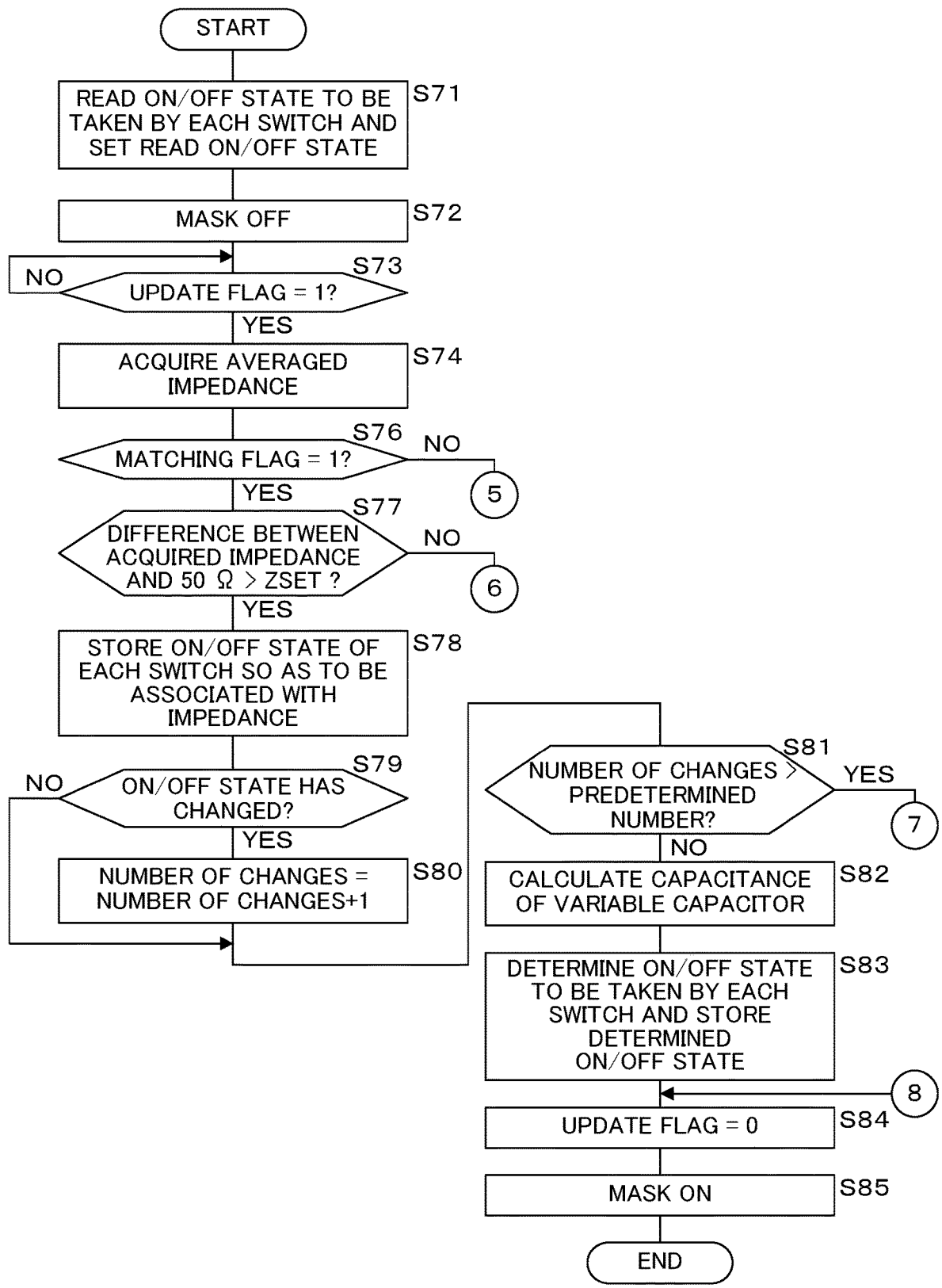
FIG. 10 is a flowchart illustrating the processing procedure of a CPU that performs an impedance matching operation in an impedance matching device according to a second embodiment.
Figure 11:
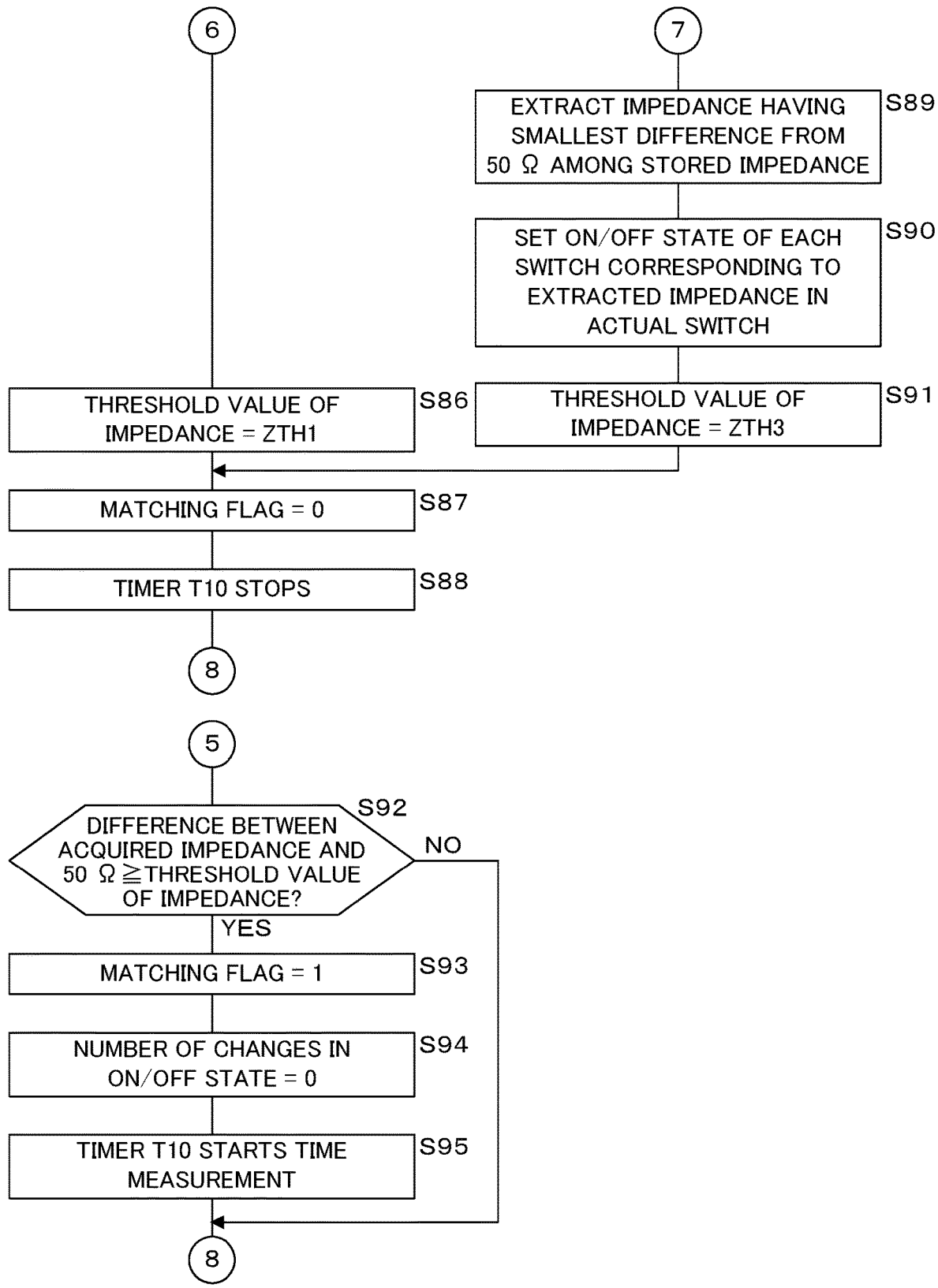
FIG. 11 is a flowchart illustrating the processing procedure of the CPU that performs an impedance matching operation in the impedance matching device according to the second embodiment.

Hereinafter, the operation of the control unit 3 described above will be described with reference to the flowchart illustrating the operation. FIGS. 10 and 11 are flowcharts illustrating the processing procedure of the CPU that performs an impedance matching operation in the impedance matching device 100 according to the second embodiment. The process illustrated in FIG. 10 is started, for example, every 1 ms and executed by the CPU of the control unit 3. Processing from step S71 to step S95 in FIGS. 10 and 11 are the same as the processing from step S31 to step S55 in FIGS. 7 and 8 of the first embodiment except for processing of steps S77, S78, S86, and S89 to S92. However, the calculation of the reflection coefficient executed in step S35 of FIG. 7 is not included in the process illustrated in FIG. 10. Therefore, the processing of steps S77, S78, S86, and S89 to S92 will be mainly described. The threshold values of impedance in FIG. 11 are assumed to have a magnitude relationship of Zset>Zth1>Zth3.

In a case where the process illustrated in FIG. 10 is started, the CPU reads ON/OFF states to be taken by the semiconductor switches 21, 22, . . . , 28 and sets the read ON/OFF states in the switch state setting unit 4 (S71). As a result, the ON/OFF states of the semiconductor switches 21, 22, . . . , 28 are set so that the capacitance of the variable capacitor 1 becomes the capacitance previously calculated in step S81 to be described later. Then, the CPU executes the processing of steps S72 and S73, acquires the averaged impedance from the pre-calculation unit 2 (S74), and then determines whether or not the matching flag is set to 1 (S76).

In a case where the matching flag is set to 1 (S76: YES), the CPU determines whether or not the difference between the impedance acquired in step S74 and 50Ω is larger than Zset (S77). In a case where the impedance difference is larger than Zset (S77: YES), the CPU stores the ON/OFF states of the semiconductor switches 21, 22, . . . , 28 read in step S71 in the storage unit 30 so as to be associated with the impedance (S78). Then, the CPU executes the processing of steps S79 and S80, and then determines whether or not the number of changes in the ON/OFF state is larger than a predetermined number of times (for example, 90 times) (S81). In a case where the number of changes is not larger than the predetermined number of times (S81: NO), the CPU executes processing from step S82 to S85, and ends the process illustrated in FIG. 10.

In a case where the impedance difference is equal to or less than Zset in step S77 (S77: NO), the process proceeds to FIG. 11 in which the CPU sets the threshold value of the impedance to Zth1 (S86), and executes processing of steps S87 and S88. As a result, the matching operation is stopped. Then, the CPU moves the processing to step S84 in FIG. 10.

In a case where the number of changes described above is larger than the predetermined number of times, the CPU performs "unstable operation prevention control". Here, a case will be described in which the difference between the acquired impedance and 50Ω does not become equal to or less than the threshold value Zset when the number of changes is equal to or less than the predetermined number of times. In a case where the number of changes is larger than the predetermined number of times in step S81 (S81: YES), the process proceeds to FIG. 11 in which the CPU extracts an impedance having the smallest difference from the impedance of the high frequency power supply 5 (hereinafter, referred to as 50Ω), that is, an impedance closest to the impedance of the high frequency power supply 5, among the impedances stored in the storage unit 30 (S89). Then, the CPU causes the switch state setting unit 4 to set the ON/OFF states of the semiconductor switches 21, 22, . . . , 28 corresponding to the extracted impedance in the actual semiconductor switches 21, 22, . . . , 28 (S90). Then, the CPU sets the threshold value of the impedance to Zth3 (S91), and moves the processing to step S87.

In a case where the matching flag is not set to 1 in step S76 (S76: NO), the process proceeds to FIG. 11 in which the CPU determines whether or not the difference between the impedance acquired in step S74 and 50Ω is equal to or greater than the threshold value of the impedance set in step S86 or S91 (S92). In a case where the difference between the impedance acquired in step S74 and 50Ω is not equal to or greater than the threshold value (S92: NO), the process proceeds to step S84 in FIG. 10. On the other hand, in a case where the above difference is equal to or greater than the threshold value of the impedance (S92: YES), the CPU executes processing of steps S93, S94, and S95, and moves the processing to step S84 in FIG. 10.

As described above, according to the second embodiment, the impedance calculated within the predetermined time T10 is stored in the storage unit 30 so as to be associated with the ON/OFF states of the semiconductor switches 21, 22, . . . , 28. Then, in order to adjust the capacitance of the variable capacitor 1 so that the impedance on the load 7 side after adjustment approaches the output impedance of the high frequency power supply 5, ON/OFF states to be taken by the semiconductor switches 21, 22, . . . , 28 are determined (step S83).

In a case where the number of times the ON/OFF states of the semiconductor switches 21, 22, . . . , 28 have changed is larger than the predetermined number of times (90 times) while such calculation, storage, and determination are executed in time series for the time T10, an impedance when the absolute value of the difference between this impedance and the impedance of the high frequency power supply 5 is the smallest, among the impedances stored in the storage unit 30, is extracted. Then, the semiconductor switches 21, 22, . . . , 28 are turned on or off according to the ON/OFF states associated with the extracted impedance, and then the ON/OFF operation is stopped. As a result, in a case where the ON/OFF states of the semiconductor switches 21, 22, . . . , 28 are changed, the ON/OFF states of the semiconductor switches 21, 22, . . . , 28 are maintained so that the impedance on the load 7 side approaches the impedance of the high frequency power supply 5. Therefore, it is possible to stabilize the state of matching with the load 7 by suppressing the fluctuation of the semiconductor switches 21, 22, . . . , 28.

In addition, according to the second embodiment, as a result of adjusting the semiconductor switches 21, 22, . . . , 28 so that the impedance on the load 7 side after adjustment approaches the impedance of the high frequency power supply 5, in a case where the ON/OFF states of the semiconductor switches 21, 22, . . . , 28 are changed and the ON/OFF switching is prohibited, the impedance on the load 7 side is continuously calculated in time series. Then, when the absolute value of the difference between the newly calculated impedance and the impedance of the high frequency power supply 5 becomes equal to or greater than the predetermined difference Zth1 or Zth3 that is larger than the absolute value of the difference between the impedance of the high frequency power supply 5 and the impedance associated with the ON/OFF states of the semiconductor switches 21, 22, . . . , 28 while ON/OFF switching is prohibited, the prohibition of the ON/OFF switching of the semiconductor switches 21, 22, . . . , 28 is released. Therefore, since a hysteresis characteristic is obtained by the prohibition and release of the ON/OFF switching of the semiconductor switches 21, 22, . . . , 28, it is possible to suppress the intermittent repetition of the fluctuation of the semiconductor switches 21, 22, . . . , 28.

The embodiments disclosed this time are to be considered in all respects as illustrative and not restrictive. The scope of the invention is indicated not by the meaning described above but by the scope of the claims, and includes all changes within the meaning and scope equivalent to the scope of the claims. In addition, the technical features described in the respective embodiments can be combined with each other.

What is claimed is:

1. An impedance matching device that is provided between a high frequency power supply and a load and acquires information regarding an impedance as the load side is viewed from an output end of the high frequency power supply or a portion equivalent to the output end in a time period and performs impedance matching between the high frequency power supply and the load, the device comprising:

a variable capacitor in which a plurality of series circuits of capacitors and semiconductor switches are connected in parallel;

a calculation unit that calculates an impedance or a reflection coefficient on the load side using the acquired information regarding the impedance;

a storage unit that stores a plurality of impedances or a plurality of reflection coefficients calculated by the calculation unit within a predetermined period so as to be associated with ON/OFF states of the semiconductor switches;

a determination unit that determines ON/OFF states to be taken by the semiconductor switches using a calculation result of the calculation unit within the predetermined period;
a control unit that turns on or off the semiconductor switches based on the ON/OFF states determined by the determination unit;
a counting unit that, during the predetermined period, counts the number of times the ON/OFF states determined by the determination unit have changed; and
an extraction unit that, in a case where the number of times counted by the counting unit is larger than a predetermined number of times, extracts an impedance having a smallest difference from a predetermined impedance or a reflection coefficient having a smallest absolute value, among the impedances or the reflection coefficients stored in the storage unit,
wherein the control unit turns on or off the semiconductor switches so as to match ON/OFF states associated with the impedance or the reflection coefficient extracted by the extraction unit and then prohibits ON/OFF switching of the semiconductor switches.

2. The impedance matching device according to claim 1, wherein the calculation unit is configured to calculate a reflection coefficient, and
in a case where the ON/OFF switching of the semiconductor switches is prohibited, the control unit releases prohibition of the ON/OFF switching when an absolute value of the reflection coefficient calculated by the calculation unit is equal to or greater than a predetermined reflection coefficient that is larger than an absolute value of the reflection coefficient extracted by the extraction unit.

3. The impedance matching device according to claim 1, wherein the calculation unit is configured to calculate an impedance, and
in a case where the ON/OFF switching of the semiconductor switches is prohibited, the control unit releases prohibition of the ON/OFF switching when an absolute value of a difference between the impedance calculated by the calculation unit and the predetermined impedance is equal to or greater than a predetermined difference that is larger than an absolute value of a difference between the impedance extracted by the extraction unit and the predetermined impedance.

4. The impedance matching device according to claim 1, wherein the counting unit counts the number of times for each of the semiconductor switches included in the variable capacitor, and determines the largest number of times as a counting result.

5. The impedance matching device according to claim 1, wherein the counting unit counts the number of times in a case where an amount of change in a capacitance of the variable capacitor, which is determined by turning on or off the semiconductor switches by the control unit, is larger than a predetermined threshold value.

6. An impedance matching method for performing impedance matching between a high frequency power supply and a load using a variable capacitor which is provided between the high frequency power supply and the load and in which a plurality of series circuits of capacitors and semiconductor switches are connected in parallel, the method comprising:
acquiring information regarding an impedance as the load side is viewed from an output end of the high frequency power supply or a portion equivalent to the output end in a time period;
calculating an impedance or a reflection coefficient on the load side using the acquired information regarding the impedance;
storing a plurality of impedances or a plurality of reflection coefficients calculated within a predetermined period so as to be associated with ON/OFF states of the semiconductor switches;
determining ON/OFF states to be taken by the semiconductor switches using a calculation result within the predetermined period;
turning on or off the semiconductor switches based on the determined ON/OFF states;
counting, during the predetermined period, the number of times the determined ON/OFF states have changed;
in a case where the counted number of times is larger than a predetermined number of times, extracting an impedance having a smallest difference from a predetermined impedance or a reflection coefficient having a smallest absolute value, among the stored impedances or reflection coefficients; and
turning on or off the semiconductor switches so as to match ON/OFF states associated with the extracted impedance or reflection coefficient and then prohibiting ON/OFF switching of the semiconductor switches.

* * * * *